(12) United States Patent
Park et al.

(10) Patent No.: US 12,080,826 B2
(45) Date of Patent: Sep. 3, 2024

(54) DISPLAY DEVICE AND METHOD OF MANUFACTURING THE SAME

(71) Applicant: Samsung Display Co., LTD., Yongin-si (KR)

(72) Inventors: Joon Seok Park, Yongin-si (KR); Myoung Hwa Kim, Seoul (KR); Tae Sang Kim, Seoul (KR); Yeon Keon Moon, Hwaseong-si (KR); Geun Chul Park, Suwon-si (KR); Jun Hyung Lim, Seoul (KR); Hye Lim Choi, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 587 days.

(21) Appl. No.: 17/171,451

(22) Filed: Feb. 9, 2021

(65) Prior Publication Data
US 2021/0328102 A1 Oct. 21, 2021

(30) Foreign Application Priority Data
Apr. 20, 2020 (KR) .................. 10-2020-0047607

(51) Int. Cl.
*H01L 33/12* (2010.01)
*H01L 27/15* (2006.01)
(Continued)

(52) U.S. Cl.
CPC ............ *H01L 33/12* (2013.01); *H01L 27/156* (2013.01); *H01L 33/0095* (2013.01); *H01L 33/56* (2013.01); *H01L 33/62* (2013.01)

(58) Field of Classification Search
CPC .......... H01L 29/78693; H01L 29/7869; H01L 29/78696; H01L 29/78648;
(Continued)

(56) References Cited

U.S. PATENT DOCUMENTS

| 2015/0228799 | A1* | 8/2015 | Koezuka | ............... H01L 27/124 257/43 |
| 2016/0322395 | A1* | 11/2016 | Koezuka | ............. H01L 27/1225 |

FOREIGN PATENT DOCUMENTS

| JP | 2019-24105 | 2/2019 |
| JP | 6467171 | 2/2019 |

(Continued)

*Primary Examiner* — Latanya N Crawford Eason
(74) *Attorney, Agent, or Firm* — KILE PARK REED & HOUTTEMAN PLLC

(57) ABSTRACT

A display device may include a first gate electrode on a substrate, a buffer layer on the first gate electrode, a first active pattern on the buffer layer, overlapping the first gate electrode, and including an oxide semiconductor, a source pattern and a drain pattern respectively on ends of the first active pattern, an insulation layer overlapping the source pattern and the drain pattern on the buffer layer, an oxygen supply pattern on the insulation layer, overlapping the first active pattern, and supplying oxygen to the first active pattern, a second active pattern on the insulation layer and spaced apart from the oxygen supply pattern, the second active pattern including a channel region, and a source region and a drain region, an insulation pattern on the channel region of the second active pattern, and a second gate electrode on the insulation pattern.

19 Claims, 18 Drawing Sheets

(51) Int. Cl.
*H01L 33/00* (2010.01)
*H01L 33/56* (2010.01)
*H01L 33/62* (2010.01)

(58) Field of Classification Search
CPC ......... H01L 29/78678; H01L 29/66765; H01L 29/78669; H01L 29/78666; H01L 29/78675; H01L 29/66757; H01L 27/1229; H01L 27/1233; H01L 27/1237; H01L 27/1251; H01L 33/12; H01L 33/0095; H01L 33/56; H01L 33/62; H01L 27/156; H10K 59/1213; H10K 59/124
See application file for complete search history.

(56) References Cited

FOREIGN PATENT DOCUMENTS

| | | |
|---|---|---|
| KR | 10-2008-0113967 | 12/2008 |
| KR | 10-2018-0070334 | 6/2018 |
| KR | 10-1895421 | 9/2018 |

\* cited by examiner

DISPLAY DEVICE AND METHOD OF MANUFACTURING THE SAME

CROSS-REFERENCE TO RELATED APPLICATION(S)

This application claims priority to and the benefit of Korean Patent Application No. 10-2020-0047607 under 35 U.S.C. § 119, filed in the Korean Intellectual Property Office (KIPO) on Apr. 20, 2020, the entire contents of which are incorporated by herein reference.

BACKGROUND

1. Technical Field

The disclosure relates to a display device, and more specifically, to a display device including transistors.

2. Description of the Related Art

A display device may include pixels and a driver for driving the pixels. Each of the pixels and the driver may include transistors.

An area in which the transistors are disposed may decrease due to an increase of the resolution of the display device and a decrease of the dead space of the display device. Accordingly, electrical characteristics of the transistors disposed in a relatively narrow space may be reduced.

SUMMARY

The embodiments provide a display device including transistors having improved electrical characteristics.

The embodiments provide a method of manufacturing a display device to reduce a manufacturing cost and a manufacturing time.

A display device according to an embodiment may include a first gate electrode disposed on a substrate, a buffer layer disposed on the first gate electrode, a first active pattern disposed on the buffer layer, overlapping the first gate electrode, and including an oxide semiconductor, a source pattern and a drain pattern respectively disposed on ends of the first active pattern, an insulation layer overlapping the source pattern and the drain pattern on the buffer layer, an oxygen supply pattern disposed on the insulation layer, overlapping the first active pattern, and supplying oxygen to the first active pattern, a second active pattern disposed on the insulation layer and spaced apart from the oxygen supply pattern, and the second active pattern including a channel region, and a source region and a drain region respectively disposed on ends of the channel region, an insulation pattern disposed on the channel region of the second active pattern, and a second gate electrode disposed on the insulation pattern.

In an embodiment, each of the oxygen supply pattern and the second active pattern may include an oxide semiconductor.

In an embodiment, the oxygen supply pattern, the second active pattern, and the first active pattern may include a same material.

In an embodiment, each of the oxygen supply pattern and the second active pattern may include a material different from a material of the first active pattern.

In an embodiment, the display device may further include an insulation interlayer overlapping the oxygen supply pattern and the second gate electrode on the insulation layer, a first source electrode and a first drain electrode disposed on the insulation interlayer and electrically connected to the source pattern and the drain pattern, respectively, and a second source electrode and a second drain electrode disposed on the insulation interlayer and electrically connected to the source region and the drain region, respectively.

In an embodiment, the display device may further include a planarization layer disposed on the insulation interlayer. The first source electrode may include a first lower source electrode disposed on the insulation interlayer, and a first upper source electrode disposed on the planarization layer and electrically connected to the first lower source electrode. The first drain electrode may include a first lower drain electrode disposed on the insulation interlayer, and a first upper drain electrode disposed on the planarization layer and electrically connected to the first lower drain electrode. The second source electrode may include a second lower source electrode disposed on the insulation interlayer, and a second upper source electrode disposed on the planarization layer and electrically connected to the second lower source electrode. The second drain electrode may include a second lower drain electrode disposed on the insulation interlayer, and a second upper drain electrode disposed on the planarization layer and electrically connected to the second lower drain electrode.

In an embodiment, the display device may further include a protective layer disposed between the insulation interlayer and the planarization layer and overlapping the first lower source electrode, the first lower drain electrode, the second lower source electrode, and the second lower drain electrode.

In an embodiment, the display device may further include a planarization layer disposed on the insulation interlayer. The first source electrode, the first drain electrode, the second source electrode, and the second drain electrode may be disposed on the planarization layer.

In an embodiment, the display device may further include a conductive pattern disposed between the substrate and the buffer layer and overlapping the second active pattern.

In an embodiment, the conductive pattern may be electrically connected to the second source electrode or the second gate electrode.

In an embodiment, the display device may further include a data line disposed between the substrate and the buffer layer and electrically connected to the first drain electrode.

In an embodiment, the display device may further include a driving voltage line disposed between the substrate and the buffer layer and electrically connected to the second drain electrode.

A display device according to an embodiment may include a first transistor disposed on a substrate and having a bottom gate structure, the first transistor including a first active pattern including an oxide semiconductor, an oxygen supply pattern disposed on the first active pattern and supplying oxygen to the first active pattern, and a second transistor disposed on the substrate and having a top gate structure, the second transistor including a second active pattern. The oxygen supply pattern and the second active pattern may be disposed on a same layer.

In an embodiment, the display device may further include a pixel including a pixel circuit and a light-emitting element electrically connected to the pixel circuit, and a scan driver that supplies a scan signal to the pixel circuit.

In an embodiment, the pixel circuit may include the first transistor and the second transistor.

In an embodiment, the second transistor may be electrically connected to the light-emitting element.

In an embodiment, the scan drive may include the first transistor and the second transistor.

A method of manufacturing a display device according to an embodiment may include forming a first gate electrode on a substrate, forming a buffer layer on the first gate electrode, forming a first active pattern overlapping the first gate electrode and including an oxide semiconductor on the buffer layer, forming a source pattern and a drain pattern respectively on ends of the first active pattern, forming an insulation layer overlapping the source pattern and the drain pattern on the buffer layer, forming simultaneously an oxygen supply pattern overlapping the first active pattern and a second active pattern spaced apart from the oxygen supply pattern on the insulation layer, forming an insulation pattern on the second active pattern, and forming a second gate electrode on the insulation pattern.

In an embodiment, the method may further include heat-treating the oxygen supply pattern to supply oxygen to the first active pattern from the oxygen supply pattern, after the forming of the oxygen supply pattern and before the forming of the insulation pattern.

In an embodiment, the first active pattern, the source pattern, and the drain pattern may be formed by a photolithography process using a halftone mask.

The display device according to the embodiments may include the oxygen supply pattern disposed on the first active pattern of the first transistor having the bottom gate structure, the oxygen supply pattern and the second active pattern of the second transistor having the bottom gate structure being disposed on the same layer, and the oxygen supply pattern may supply oxygen to the first active pattern. Accordingly, electrical characteristics of the first transistor may be improved.

In the method of manufacturing the display device according to the embodiments, the oxygen supply pattern and the second active pattern may be substantially simultaneously formed. Accordingly, an additional process for forming the oxygen supply pattern may not be required, and a manufacturing cost and a manufacturing time of the display device may be reduced.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Hereinafter, display devices and methods of manufacturing display devices in accordance with embodiments will be explained in detail with reference to the accompanying drawings.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Figure 1:
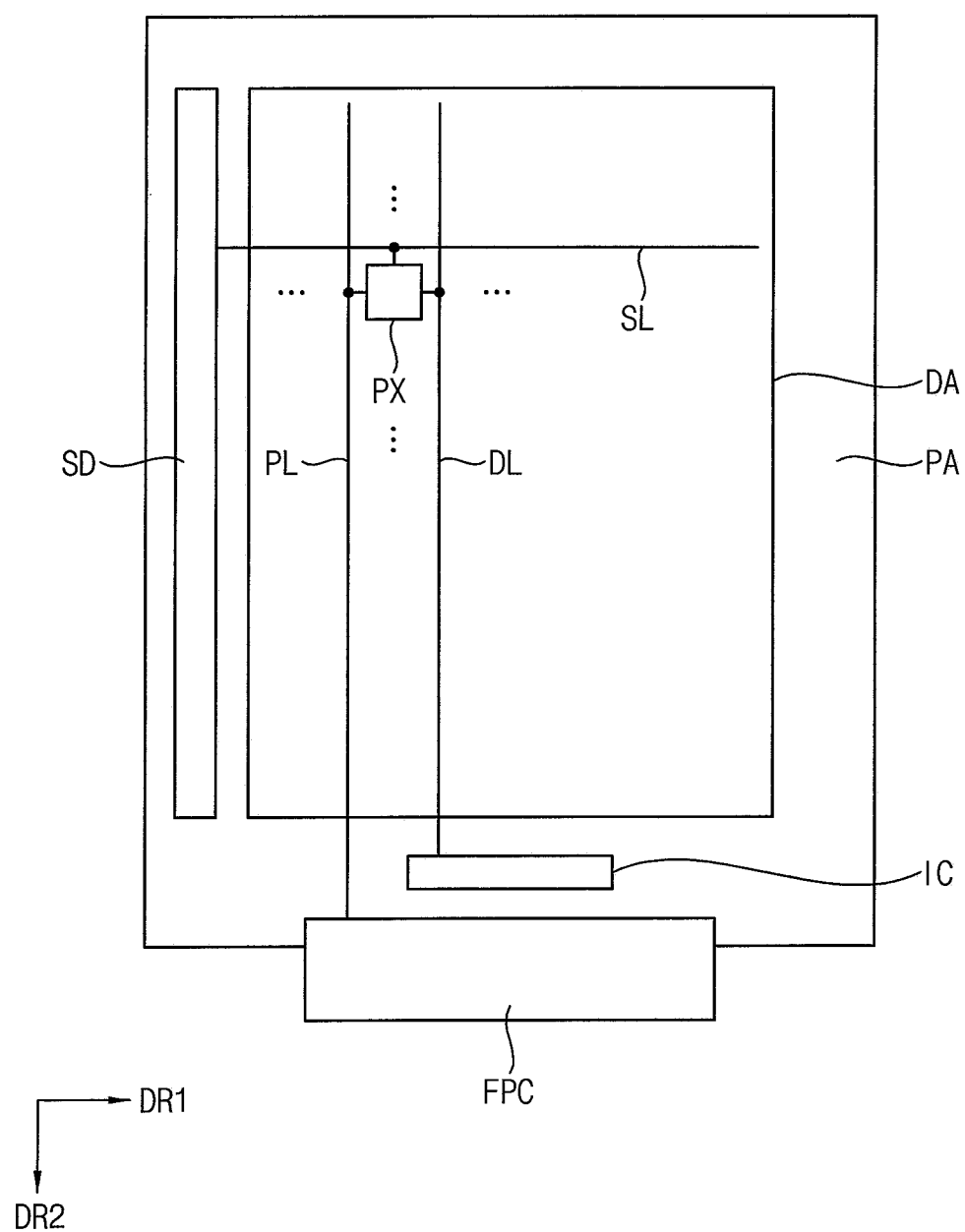
FIG. 1 is a schematic plan view illustrating a display device according to an embodiment.

FIG. 1 is a schematic plan view illustrating a display device according to an embodiment.

Referring to FIG. 1, a display device may include pixels PX disposed in a display area DA and a scan driver SD, a driver chip IC, and a flexible printed circuit FPC disposed in a peripheral area PA.

The pixels PX may be arranged in a first direction DR1 and a second direction DR2 intersecting the first direction DR1 in the display area DA. Each pixel PX may be electrically connected to a scan line SL, a data line DL, and a driving voltage line PL. The scan line SL may extend in the first direction DR1 and may provide a scan signal to the pixel PX. The data line DL may extend in the second direction DR2 and may provide a data signal to the pixel PX. The driving voltage line PL may extend parallel to the data line DL, and may provide a driving voltage to the pixel PX. The display area DA may display an image with light emitted from each of the pixels PX.

The peripheral area PA may be adjacent to the display area DA. In an embodiment, the peripheral area PA may surround the display area DA.

The scan driver SD may be disposed on a first side of the display area DA and may be electrically connected to the scan line SL. The scan driver SD may provide the scan signal to the pixel PX through the scan line SL. The scan driver SD may include transistors.

The driver chip IC may be disposed on a second side of the display area DA and may be electrically connected to the data line DL. The driver chip IC may include a data driver that generates the data voltage.

The flexible printed circuit FPC may be disposed on the second side of the display area DA with the driver chip IC disposed therebetween and may be electrically connected to the driving voltage line PL. The flexible printed circuit FPC may include a power supply that generates the driving voltage. The power supply may provide the driving voltage to the pixel PX through the driving voltage line PL.

Figure 2:
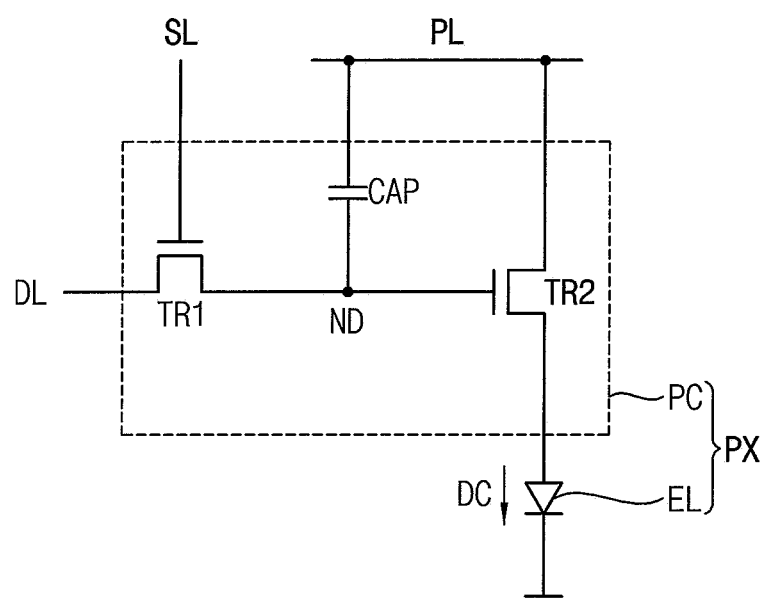
FIG. 2 is a schematic circuit diagram illustrating a pixel according to an embodiment.

FIG. 2 is a schematic circuit diagram illustrating a pixel according to an embodiment.

Referring to FIG. 2, a pixel PX may include a pixel circuit PC and a light-emitting element EL electrically connected to the pixel circuit PC. In an embodiment, the pixel circuit PC may include a first transistor TR1, a second transistor TR2, and a capacitor CAP. However, the invention is not limited thereto, and in another embodiment, the pixel circuit PC may include three or more transistors and/or two or more capacitors.

The first transistor TR1 may be electrically connected to the data line DL and a node ND. The first transistor TR1 may include a first drain electrode receiving the data voltage from the data line DL, a first source electrode electrically connected to the node ND, and a first gate electrode receiving the scan signal from the scan line SL. The first transistor TR1 may transmit the data voltage to the node ND based on the scan signal.

The second transistor TR2 may be electrically connected to the driving voltage line PL and the light-emitting element EL. The second transistor TR2 may include a second drain electrode receiving the driving voltage from the driving voltage line PL, a second source electrode electrically connected to the light-emitting element EL, and a second gate electrode electrically connected to the node ND. The second transistor TR2 may provide a driving current DC to the light-emitting element EL based on a voltage between the second drain electrode and the second gate electrode.

The capacitor CAP may be electrically connected between the driving voltage line PL and the node ND. The capacitor CAP may include a first electrode receiving the driving voltage from the driving voltage line PL and a second electrode electrically connected to the node ND. The capacitor CAP may maintain the voltage between the second drain electrode and the second gate electrode in case that the first transistor TR1 is turned off.

The light-emitting element EL may be electrically connected between the second transistor TR2 and a common power source. The light-emitting element EL may include a first electrode electrically connected to the second transistor TR2 and a second electrode receiving a common voltage from the common power source. The light-emitting element EL may emit light based on the driving current DC provided from the second transistor TR2.

Figure 3:
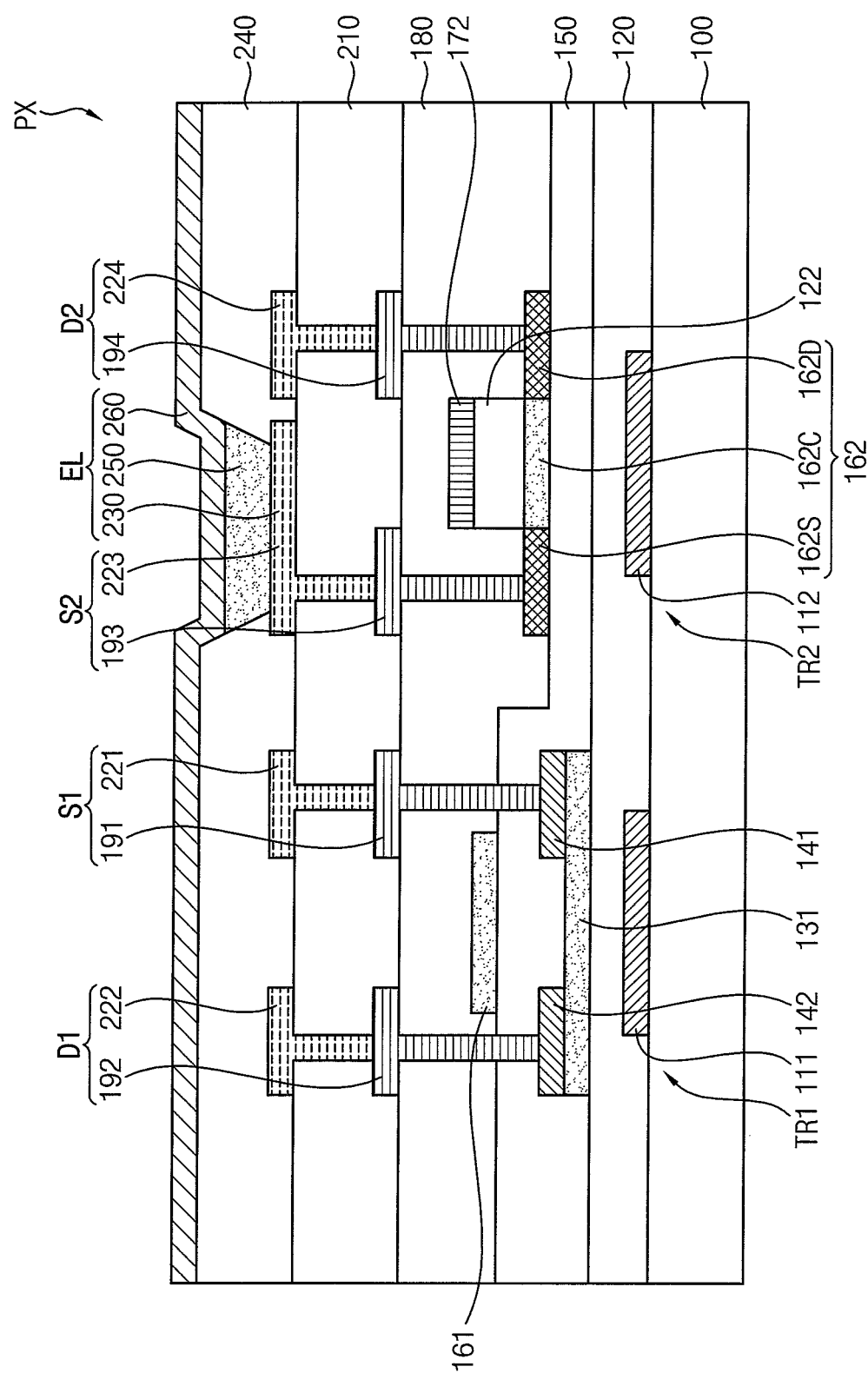
FIG. 3 is a schematic cross-sectional view illustrating a pixel according to an embodiment.

FIG. 3 is a schematic cross-sectional view illustrating a pixel PX according to an embodiment.

Referring to FIG. 3, a pixel PX may include a first transistor TR1, a second transistor TR2, and a light-emitting element EL disposed on a substrate 100.

The substrate 100 may be a transparent insulating substrate. For example, the substrate 100 may be formed of glass, quartz, plastic, or the like.

A first gate electrode 111 and a conductive pattern 112 may be disposed on the substrate 100. The first gate electrode 111 may function as a gate electrode of the first transistor TR1. The conductive pattern 112 may be spaced apart from the first gate electrode 111. The conductive pattern 112 may prevent external light, impurities, or the like from being flowed into the second transistor TR2 through the substrate 100. The first gate electrode 111 and the conductive pattern 112 may be formed of or include a conductive material such as molybdenum (Mo), copper (Cu), aluminum (Al), titanium (Ti), or the like.

A buffer layer 120 may be disposed on the first gate electrode 111 and the conductive pattern 112. The buffer layer 120 may cover or overlap the first gate electrode 111 and the conductive pattern 112 on the substrate 100. The buffer layer 120 may block inflow of impurities through the substrate 100. Further, the buffer layer 120 may provide a planarized surface above the substrate 100. The buffer layer 100 may be formed of or include an inorganic insulation material such as silicon nitride, silicon oxide, silicon oxynitride, or the like.

A first active pattern 131 may be disposed on the buffer layer 120. The first active pattern 131 may overlap the first gate electrode 111. The first active pattern 131 may be formed of an oxide semiconductor. The oxide semiconductor may include at least one oxide of indium (In), gallium (Ga), zinc (Zn), tin (Sn), titanium (Ti), zirconium (Zr), and hafnium (Hf).

A source pattern 141 and a drain pattern 142 may be respectively disposed on ends (or opposite ends) of the first active pattern 131. Each of the source pattern 141 and the drain pattern 142 may be formed of or include a conductive material such as molybdenum (Mo), copper (Cu), aluminum (Al), titanium (Ti), or the like. The first active pattern 131 may function as a channel region of the first transistor TR1, and the source pattern 141 and the drain pattern 142 may function as a source region and a drain region of the first transistor TR1, respectively.

An insulation layer 150 may cover or overlap the first active pattern 131, the source pattern 141, and the drain pattern 142 on the buffer layer 120. The insulation layer 150 may be formed of an inorganic insulation material such as silicon nitride, silicon oxide, silicon oxynitride, or the like.

An oxygen supply pattern 161 and the second active pattern 162 may be disposed on the insulation layer 150. The oxygen supply pattern 161 may overlap the first active pattern 131. The second active pattern 162 may be spaced apart from the oxygen supply pattern 161 and may overlap the conductive pattern 112. The oxygen supply pattern 161 may supply oxygen to the first active pattern 131 through the insulation layer 150. For example, oxygen may be supplied from the oxygen supply pattern 161 to the insulation layer 150 when the oxygen supply pattern 161 is formed on the insulation layer 150. Oxygen may then be supplied from the insulation layer 150 to the first active pattern 131, in case that the oxygen supply pattern 161 is heat-treated.

In case that the oxygen supply pattern 161 is not disposed on the first active pattern 131, the first active pattern 131 may have an oxygen vacancy. In this case, charge carriers (e.g., holes) in the first active pattern 131 may increase, so that an initial threshold voltage of the first transistor TR1 may be shifted.

However, in an embodiment, the oxygen supply pattern 161 disposed on the first active pattern 131 may supply oxygen to the first active pattern 131, so that the oxygen vacancy of the first active pattern 131 may decrease. Therefore, the shift of the initial threshold voltage of the first transistor TR1 may decrease or may be substantially prevented. Accordingly, electrical characteristics of the first transistor TR1 may be improved.

Each of the oxygen supply pattern 161 and the second active pattern 162 may be formed of an oxide semiconductor. The oxide semiconductor may include at least one oxide of indium (In), gallium (Ga), zinc (Zn), tin (Sn), titanium (Ti), zirconium (Zr), and hafnium (Hf). In an embodiment, each of the oxygen supply pattern 161 and the second active pattern 162 may include the same material as the first active pattern 131. In another embodiment, each of the oxygen supply pattern 161 and the second active pattern 162 may include a different material from the first active pattern 131.

The second active pattern 162 may include a channel region 162C, a source region 162S and a drain region 162D respectively disposed on ends (or opposite ends) of the channel region 162C. The source region 162S and the drain region 162D may be doped with P-type or N-type impurities, and the channel region 162C may be doped with impurities of different types from those of the source region 162S and the drain region 162D. In an embodiment, the source region 162S and the drain region 162D may be doped with N-type impurities, and the channel region 162C may be doped with P-type impurities.

An insulation pattern 122 may be disposed on the channel region 162C of the second active pattern 162. The insulation pattern 122 may be formed of an inorganic insulation material such as silicon nitride, silicon oxide, silicon oxynitride, or the like.

A second gate electrode 172 may be disposed on the insulation pattern 122. The second gate electrode 172 may overlap the channel region 162C of the second active pattern 162. The second gate electrode 172 may function as a gate electrode of the second transistor TR2. The second gate electrode 172 may be formed of a conductive material such as molybdenum (Mo), copper (Cu), aluminum (Al), titanium (Ti), or the like.

In an embodiment, the second gate electrode 172 may be electrically connected to the conductive pattern 112. In such an embodiment, the second gate electrode 172 may function as an upper gate electrode of the second transistor TR2, and the conductive pattern 112 may function as a lower gate electrode of the second transistor TR2. Accordingly, the second transistor TR2 may have a dual gate structure, and the second transistor TR2 may have a relatively high electron mobility.

The first gate electrode 111, the first active pattern 131, the source pattern 141, and the drain pattern 142 may form the first transistor TR1. The first transistor TR1 may have a bottom gate structure in which the first gate electrode 111 is disposed under the first active pattern 131.

The second active pattern 162 including the channel region 162C, the source region 162S and the drain region 162D, and the second gate electrode 172 may form the second transistor TR2. The second transistor TR2 may have a top gate structure in which the second gate electrode 172 is disposed over or on the second active pattern 162.

Although not illustrated in FIG. 3, each of the first electrode and the second electrode of the capacitor CAP of FIG. 2 and one of the first gate electrode 111, the first active pattern 131, the source pattern 141, the oxygen supply pattern 161, and the second gate electrode 172 may be disposed on the same layer. For example, the first electrode of the capacitor CAP may be disposed on the same layer as the source pattern 141, and the second electrode of the capacitor CAP may be disposed on the same layer as the second gate electrode 172.

An insulation interlayer 180 may be disposed on the oxygen supply pattern 161 and the second gate electrode 172. The insulation interlayer 180 may cover or overlap the oxygen supply pattern 161, the second gate electrode 172, and the second active pattern 162 on the insulation layer 150. The insulation interlayer 180 may be formed of or include an inorganic insulation material such as silicon nitride, silicon oxide, silicon oxynitride, or the like.

A first source electrode S1, a first drain electrode D1, a second source electrode S2, and a second drain electrode D2 may be disposed on the insulation inter layer 180. The first source electrode S1 may be electrically connected to the source pattern 141, and the first drain electrode D1 may be electrically connected to the drain pattern 142. The second source electrode S2 may be electrically connected to the source region 162S, and the second drain electrode D2 may be electrically connected to the drain region 162D.

In an embodiment, the second source electrode S2 may be electrically connected to the conductive pattern 112. In this case, output saturation characteristics of the second transistor TR2 may be improved, and a driving range of the second transistor TR2 may increase.

In an embodiment, the first source electrode S1 may include a first lower source electrode 191 and a first upper source electrode 221, and the first drain electrode D1 may include a first lower drain electrode 192 and a first upper drain electrode 222. The second source electrode S2 may include a second lower source electrode 193 and a second upper source electrode 223, and the second drain electrode D2 may include a second lower drain electrode 194 and a second upper drain electrode 224.

The first lower source electrode 191, the first lower drain electrode 192, the second lower source electrode 193, and the second lower drain electrode 194 may be disposed on the insulation interlayer 180. The first lower source electrode 191 may be electrically connected to the source pattern 141 through or in a contact hole formed in the insulation layer 150 and the insulation interlayer 180, and the first lower drain electrode 192 may be electrically connected to the drain pattern 142 through or in a contact hole formed in the insulation layer 150 and the insulation interlayer 180. The second lower source electrode 193 may be electrically connected to the source region 162S through or in a contact hole formed in the insulation interlayer 180, and the second lower drain electrode 194 may be electrically connected to the drain region 162D through or in a contact hole formed in the insulation interlayer 180. The first lower source electrode 191, the first lower drain electrode 192, the second lower source electrode 193, and the second lower drain electrode 194 may be formed of a conductive material such as molybdenum (Mo), copper (Cu), aluminum (Al), titanium (Ti), or the like.

A planarization layer 210 may be formed on the first lower source electrode 191, the first lower drain electrode 192, the second lower source electrode 193, and the second lower drain electrode 194. The planarization layer 210 may overlap the first lower source electrode 191, the first lower drain electrode 192, the second lower source electrode 193, and the second lower drain electrode 194 on the insulation interlayer 180. The planarization layer 210 may be formed of an organic insulation material such as polyimide (PI) or the like.

The first upper source electrode 221, the first upper drain electrode 222, the second upper source electrode 223, and the second upper drain electrode 224 may be disposed on the planarization layer 210. The first upper source electrode 221 may be electrically connected to the first lower source electrode 191 through or in a contact hole formed in the planarization layer 210, and the first upper drain electrode 222 may be electrically connected to the first lower drain electrode 192 through or in a contact hole formed in the planarization layer 210. The second upper source electrode 223 may be electrically connected to the second lower source electrode 193 through or in a contact hole formed in the planarization layer 210, and the second upper drain electrode 224 may be electrically connected to the second lower drain electrode 194 through or in a contact hole formed in the planarization layer 210. The first upper source electrode 221, the first upper drain electrode 222, the second upper source electrode 223, and the second upper drain electrode 224 may be formed of or include a conductive material such as metal, alloy, transparent conductive oxide, or the like. For example, the conductive material may include silver (Ag), indium tin oxide (ITO), or the like.

A first electrode 230 may be disposed on the planarization layer 210. The second upper source electrode 223 may extend to form the first electrode 230. In other words, the first electrode 230 and the second upper source electrode 223 may be integral with each other. Accordingly, the first electrode 230 may be electrically connected to the second transistor TR2.

Reliability of the second transistor TR2 against positive bias stress may be important because the second transistor TR2 consistently supplies the driving current to the light-emitting element EL. Compared to the first transistor TR1 having the bottom gate structure, the second transistor TR2 having the top gate structure may have desired reliability against the positive bias stress. Therefore, it may be advantageous that the first electrode 230 is electrically connected to the second transistor TR2 rather than the first transistor TR1.

A pixel defining layer 240 may be disposed on the first upper source electrode 221, the first upper drain electrode 222, the second upper source electrode 223, the second upper drain electrode 224, and the first electrode 230. The pixel defining layer 240 may overlap the first upper source electrode 221, the first upper drain electrode 222, the second upper source electrode 223, the second upper drain electrode 224, and the first electrode 230 on the planarization layer 210. The pixel defining layer 240 may include a pixel opening exposing at least a portion of the first electrode 230. In an embodiment, the pixel opening may expose a central portion of the first electrode 230, and the pixel defining layer 240 may overlap a peripheral portion of the first electrode 230. The pixel defining layer 240 may be formed of an organic insulation material such as polyimide (PI) or the like.

An emission layer 250 may be disposed on the first electrode 230. The emission layer 250 may be disposed on the first electrode 230 exposed by the pixel opening. The emission layer 250 may be formed of at least one of an organic light emitting material and a quantum dot.

In an embodiment, the organic light emitting material may include a low molecular organic compound or a high molecular organic compound. For example, the low molecular organic compound may include copper phthalocyanine, diphenylbenzidine (N, N'-diphenylbenzidine), trihydroxyquinoline aluminum (tris-(8-hydroxyquinoline)aluminum), and the like. The high molecular organic compound may include poly ethylenedioxythiophene (poly(3,4-ethylenedioxythiophene), polyaniline, polyphenylenevinylene, polyfluorene, and the like.

In an embodiment, the quantum dot may include a core including a group II-VI compound, a group III-V compound, a group IV-VI compound, a group IV element, a group IV compound, and a combination thereof. In one embodiment, the quantum dot can have a core-shell structure including a core and a shell surrounding the core. The shell may prevent chemical denaturation of the core, thereby serving as a protective layer for maintaining semiconductor characteristics and a charging layer for imparting electrophoretic characteristics to the quantum dot.

A second electrode 260 may be disposed on the emission layer 250. In an embodiment, the second electrode 260 may also be disposed on the pixel defining layer 240. The second electrode 260 may be formed of a conductive material such as metal, alloy, transparent conductive oxide, or the like. For example, the conductive material may include aluminum (Al), platinum (Pt), silver (Ag), magnesium (Mg), gold (Au), chromium (Cr), tungsten (W), titanium (Ti), or the like. The first electrode 230, the emission layer 250, and the second electrode 260 may form the light-emitting element EL.

Figure 4:
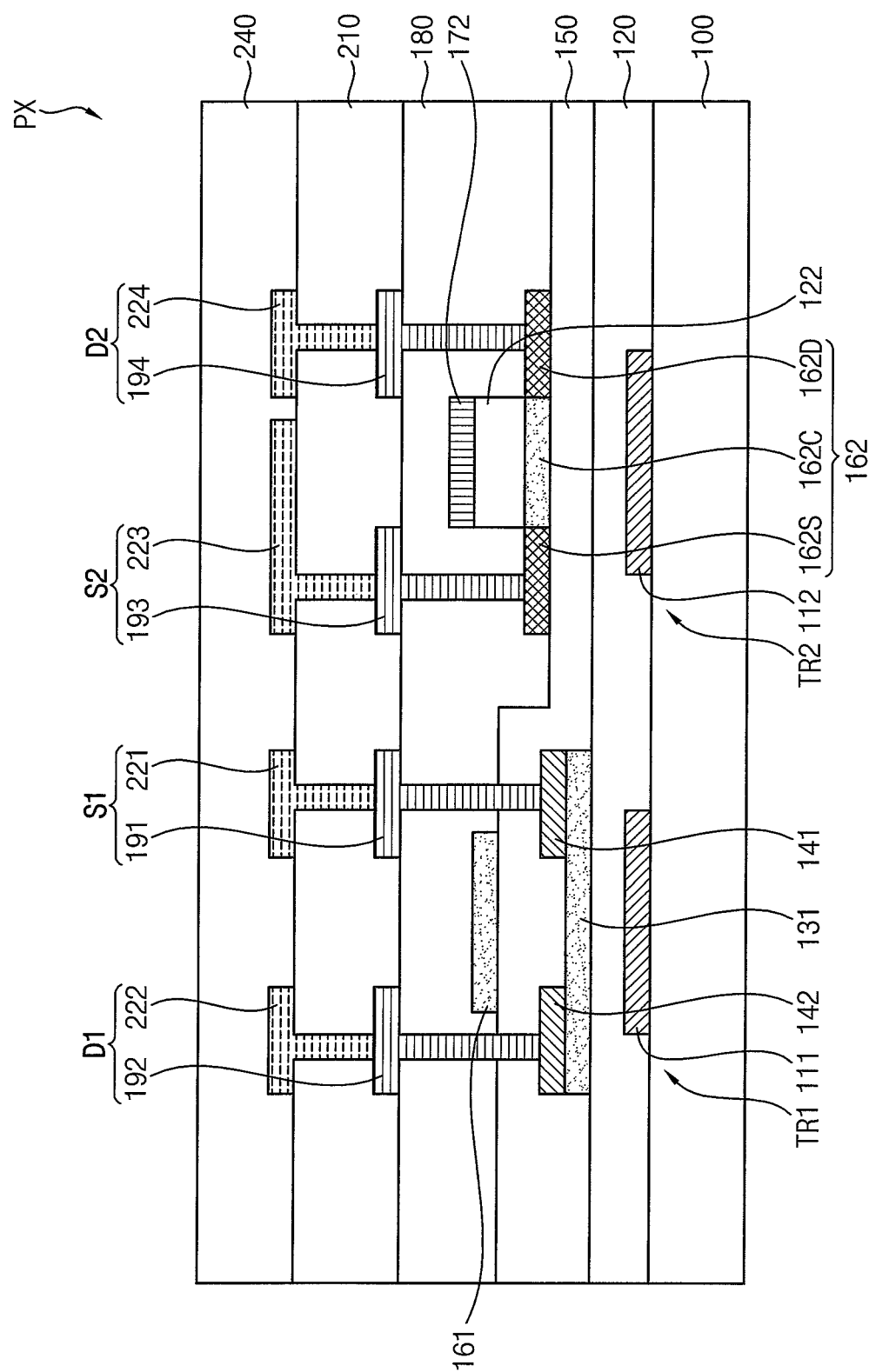
FIG. 4 is a schematic cross-sectional view illustrating a scan driver according to an embodiment.

FIG. 4 is a schematic cross-sectional view illustrating a scan driver SD according to an embodiment.

Referring to FIG. 4, a scan driver SD may include a first transistor TR1 and a second transistor TR2 disposed on a substrate 100. The scan driver SD described with reference to FIG. 4 may be substantially the same as or similar to the pixel PX described with reference to FIG. 3 except that the pixel defining layer 240 does not include the pixel opening and the scan driver SD does not include the light-emitting element EL. Accordingly, repetitive descriptions will be omitted.

FIGS. 5A, 5B, 5C, 5D, 5E, 5F, 5G, 5H, 5I, and 5J are schematic cross-sectional views illustrating a method of manufacturing a display device according to an embodiment.

Figure 5A:
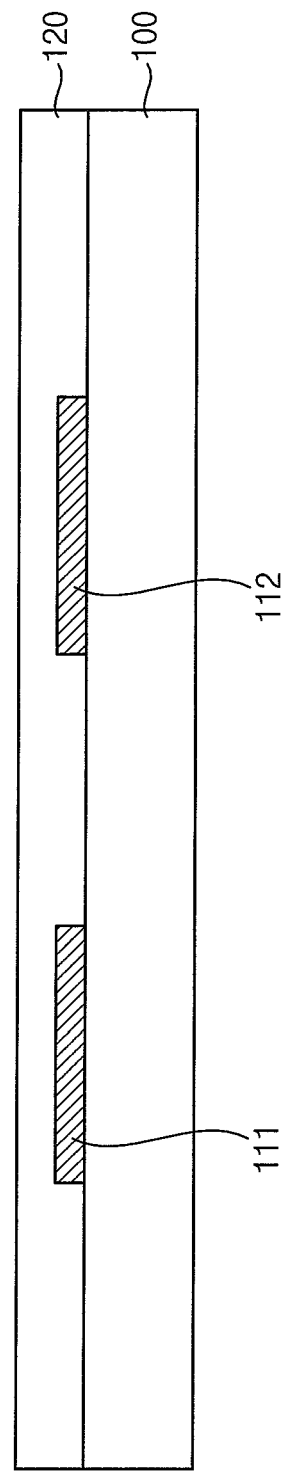
FIGS. 5A, 5B, 5C, 5D, 5E, 5F, 5G, 5H, 5I, and 5J are schematic cross-sectional views illustrating a method of manufacturing a display device according to an embodiment.

Referring to FIG. 5A, a first gate electrode 111 and a conductive pattern 112 may be formed on a substrate 100, and a buffer layer 120 may be formed on the first gate electrode 111 and the conductive pattern 112.

First, a conductive layer may be formed on the substrate 100, and the conductive layer may be etched to form the first gate electrode 111 and the conductive pattern 112. Then, the buffer layer 120 overlapping the first gate electrode 111 and the conductive pattern 112 may be formed on the substrate 100.

Figure 5B:
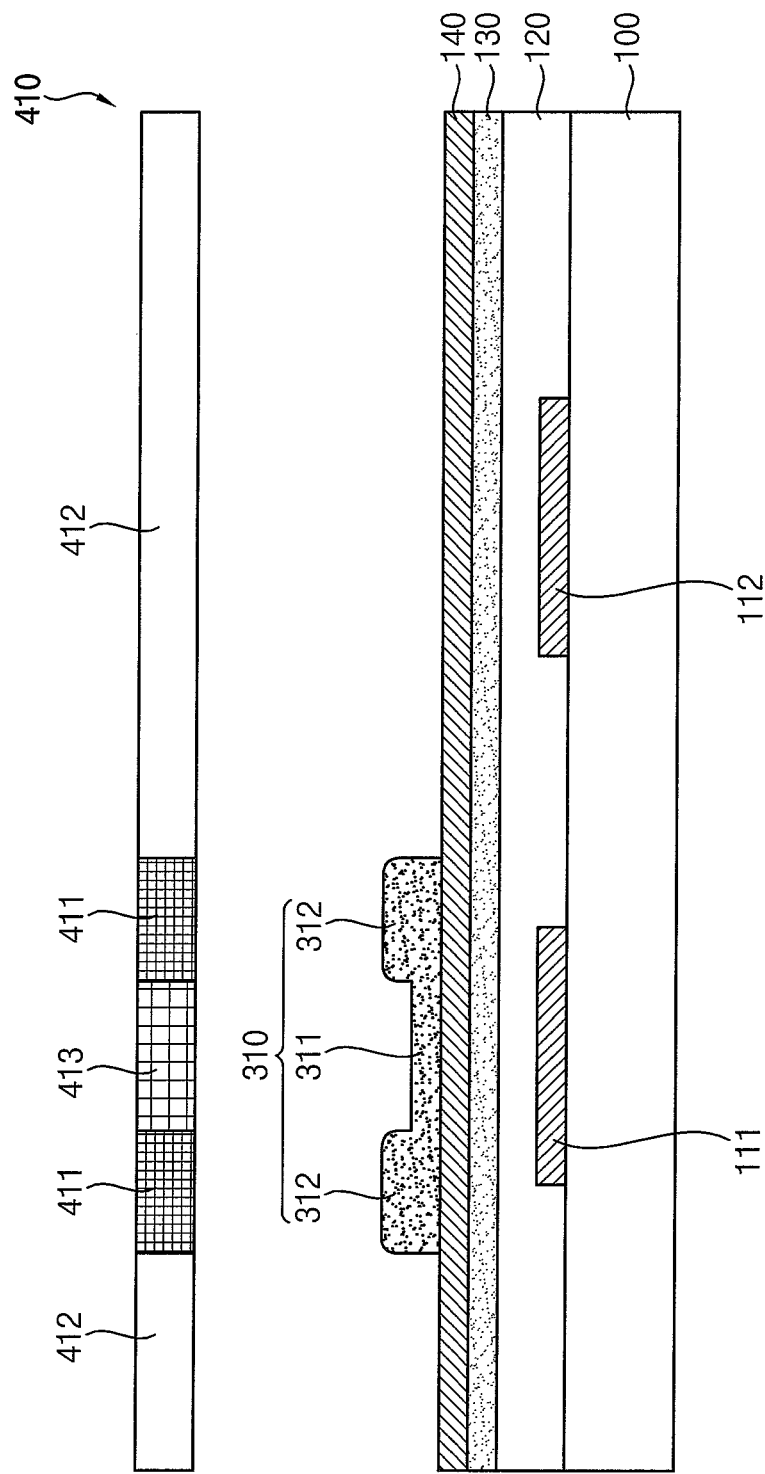
Figure 5C:
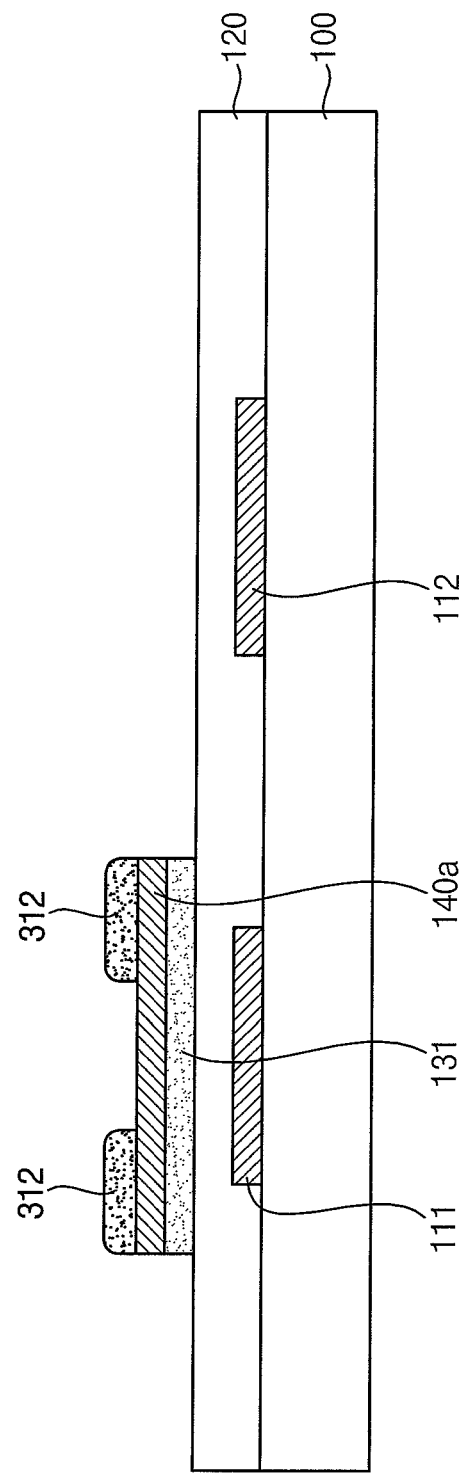
Figure 5D:
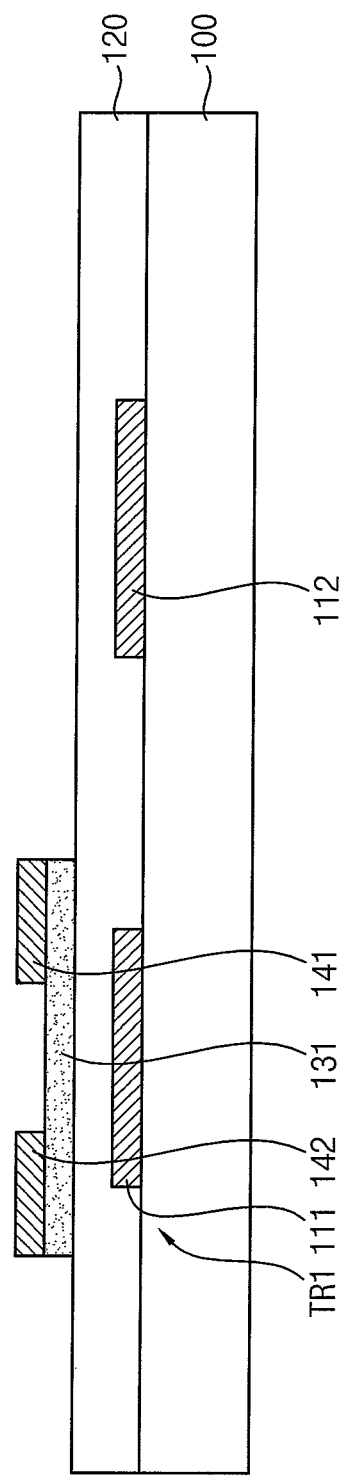

Referring to FIGS. 5B, 5C, and 5D, a first active pattern 131, a source pattern 141, and a drain pattern 142 may be formed on the buffer layer 120.

In an embodiment, the first active pattern 131, the source pattern 141, and the drain pattern 142 may be formed by a photolithography process using a halftone mask 410.

First, an active layer 130 and a conductive layer 140 may be sequentially formed on the buffer layer 120. Then, a photoresist layer may be formed on the conductive layer 140, and the photoresist layer may be patterned using the halftone mask 410 to form a photoresist pattern 310.

The halftone mask 410 may include a light-blocking portion 411, a light-transmitting portion 412, and a semi-transmitting portion 413. The light-blocking portion 411 may block most of external light, and the light-transmitting portion 412 may transmit most of the external light. The semi-transmitting portion 413 may have a transmittance greater than a transmittance of the light-blocking portion 411 and less than a transmittance of the light-transmitting portion 412. The light-blocking portion 411 may be positioned to correspond to the source pattern 141 and the drain pattern 142, and the semi-transmitting portion 413 may be positioned to correspond to a portion of the first active pattern 131 between the source pattern 141 and the drain pattern 142.

The photoresist layer may be exposed and developed using the halftone mask 410 so that the photoresist pattern 310 may be formed. The photoresist pattern 310 may include a first portion 311 and second portions 312 respectively protruding from ends (or opposite ends) of the first portion 311.

Then, the active layer 130 and the conductive layer 140 may be etched using the photoresist pattern 310 as an etch mask to form the first active pattern 131 and a conductive pattern 140a. Then, the photoresist pattern 310 may be ashed such that the second portions 312 of the photoresist pattern 310 may remain. Then, the conductive pattern 140a may be etched using the second portion 312 of the photoresist pattern 310 as an etch mask to form the source pattern 141 and the drain pattern 142. Accordingly, the first active pattern 131, the source pattern 141, and the drain pattern 142 may be formed by a photolithography process.

Figure 5E:
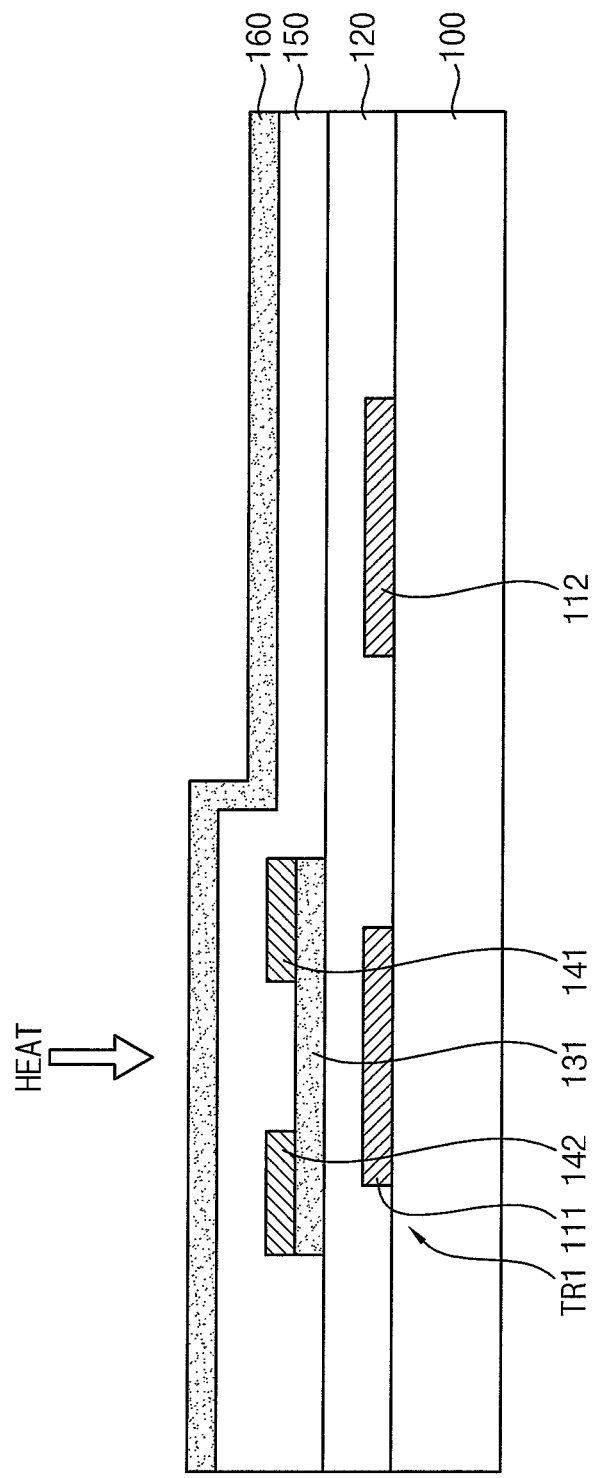

Referring to FIG. 5E, an insulation layer 150 may be formed on the first active pattern 131, the source pattern 141, and the drain pattern 142, and an oxide semiconductor layer 160 may be formed on the insulation layer 150. In an embodiment, the oxide semiconductor layer 160 may be heat-treated after forming the oxide semiconductor layer 160. Oxygen may be supplied from the oxide semiconductor layer 160 to the insulation layer 150 in the process of forming the oxide semiconductor layer 160 on the insulation layer 150 or heat-treating the oxide semiconductor layer 160.

Figure 5F:
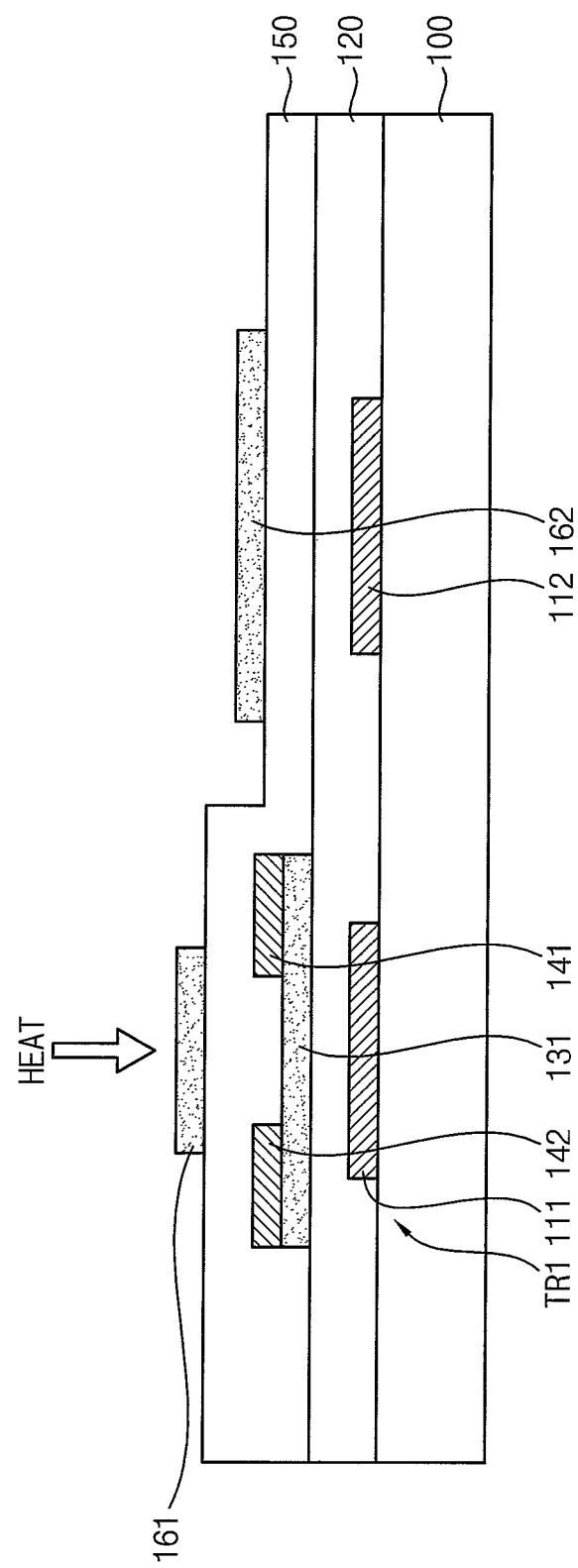

Referring to FIG. 5F, an oxygen supply pattern 161 and a second active pattern 162 may be formed on the insulation layer 150.

First, the oxide semiconductor layer 160 may be etched to form the oxygen supply pattern 161 and the second active pattern 162. Accordingly, the oxygen supply pattern 161 and the second active pattern 162 may be substantially simultaneously formed.

Then, in an embodiment, the oxygen supply pattern 161 may be heat-treated to supply oxygen to the first active pattern 131. The first active pattern 131 may include an oxygen vacancy. Oxygen may be supplied to the first active pattern 131 from the insulation layer 150 by heat-treating the oxygen supply pattern 161, so that the oxygen vacancy of the first active pattern 131 may decrease.

Figure 5G:
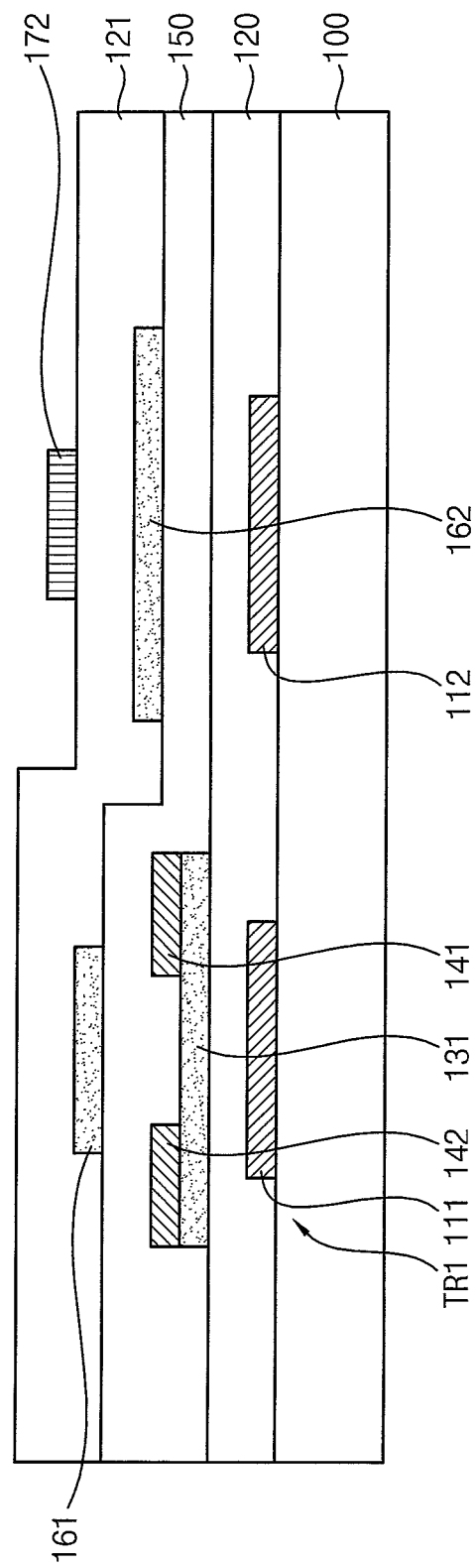
Figure 5H:
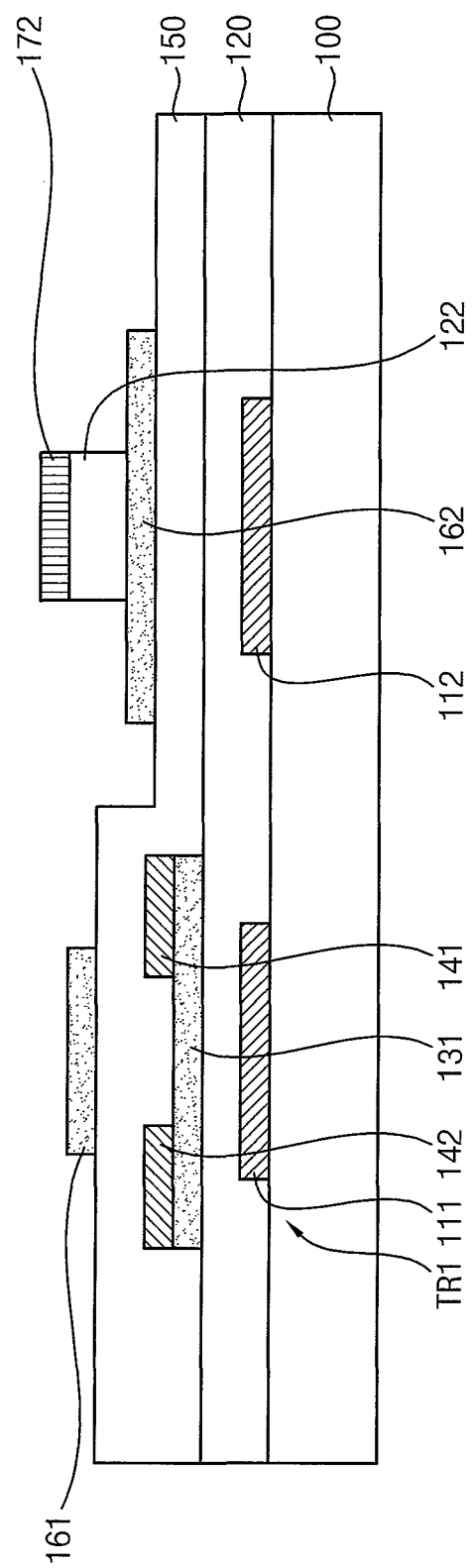

Referring to FIGS. 5G and 5H, an insulation pattern 122 and a second gate electrode 172 may be formed on the second active pattern 162.

First, an insulation layer 121 overlapping the oxygen supply pattern 161 and the second active pattern 162 may be formed on the insulation layer 150, and a conductive layer may be formed on the insulation layer 121. Next, the conductive layer may be etched to form the second gate electrode 172. Then, the insulation layer 121 may be etched using the second gate electrode 172 as an etch mask to form the insulation pattern 122.

Figure 5I:
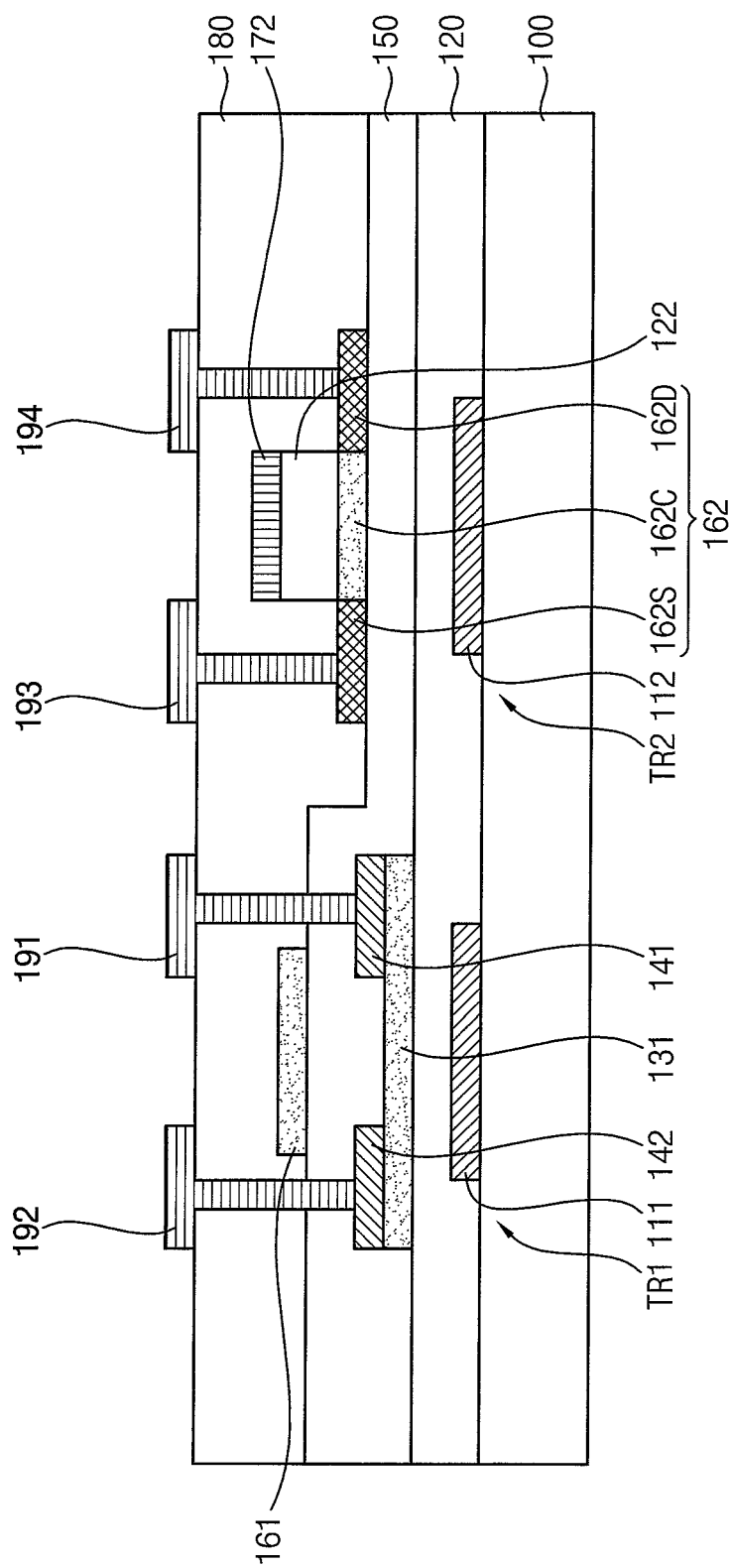

Referring to FIG. 5I, an insulation interlayer 180 may be formed on the oxygen supply pattern 161 and the second gate electrode 172; and a first lower source electrode 191, a first lower drain electrode 192, a second lower source electrode 193, and a second lower drain electrode 194 may be formed on the insulation interlayer 180.

First, the insulation interlayer 180 overlapping the oxygen supply pattern 161, the second gate electrode 172, and the second active pattern 162 may be formed on the insulation layer 150. The insulation interlayer 180 may contact the second active pattern 162, such that impurities may be injected to ends (or opposite ends) of the second active pattern 162 to form a source region 162S and a drain region 162D.

Next, contact holes respectively exposing the source pattern 141 and the drain pattern 142 may be formed in the insulation interlayer 180 and the insulation layer 150; and contact holes respectively exposing the source region 162S and the drain region 162D may be formed in the insulation interlayer 180. Then, a conductive layer filling the contact holes may be formed on the insulation interlayer 180; and the conductive layer may be etched to form the first lower source electrode 191, the first lower drain electrode 192, the second lower source electrode 193, and the second lower drain electrode 194.

Figure 5J:
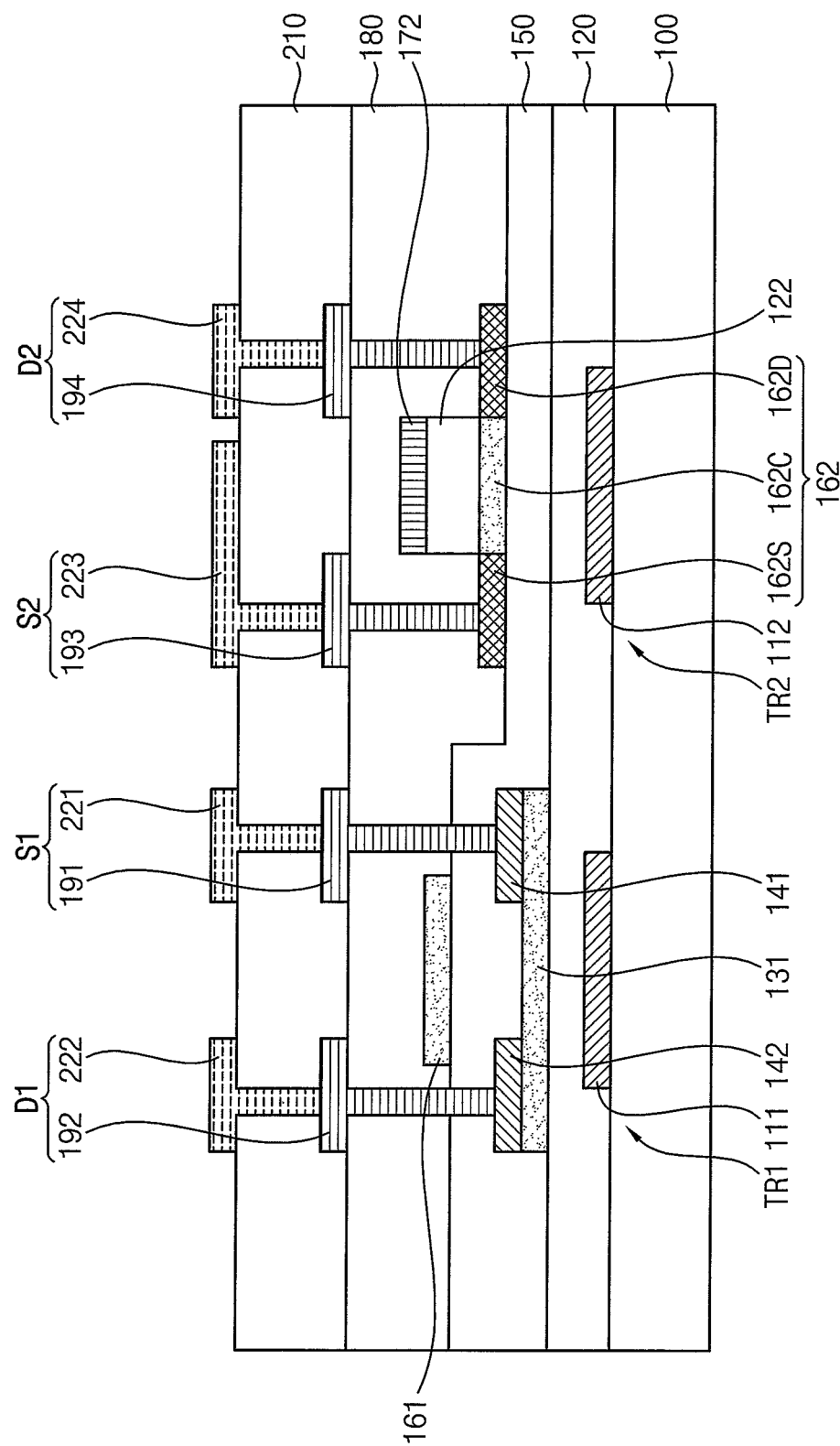

Referring to FIG. 5J, a planarization layer 210 may be formed on the first lower source electrode 191, the first lower drain electrode 192, the second lower source electrode 193, and the second lower drain electrode 194; and a first upper source electrode 221, a first upper drain electrode 222, a second upper source electrode 223, and a second upper drain electrode 224 may be formed on the planarization layer 210.

First, the planarization layer 210 overlapping the first lower source electrode 191, the first lower drain electrode 192, the second lower source electrode 193, and the second lower drain electrode 194 may be formed on the insulation interlayer 180. Then, contact holes respectively exposing the first lower source electrode 191, the first lower drain electrode 192, the second lower source electrode 193, and the second lower drain electrode 194 may be formed in the planarization layer 210. Next, a conductive layer filling the contact holes may be formed on the planarization layer 210; and the conductive layer may be etched to form the first upper source electrode 221, the first upper drain electrode 222, the second upper source electrode 223, and the second upper drain electrode 224.

Figure 6:
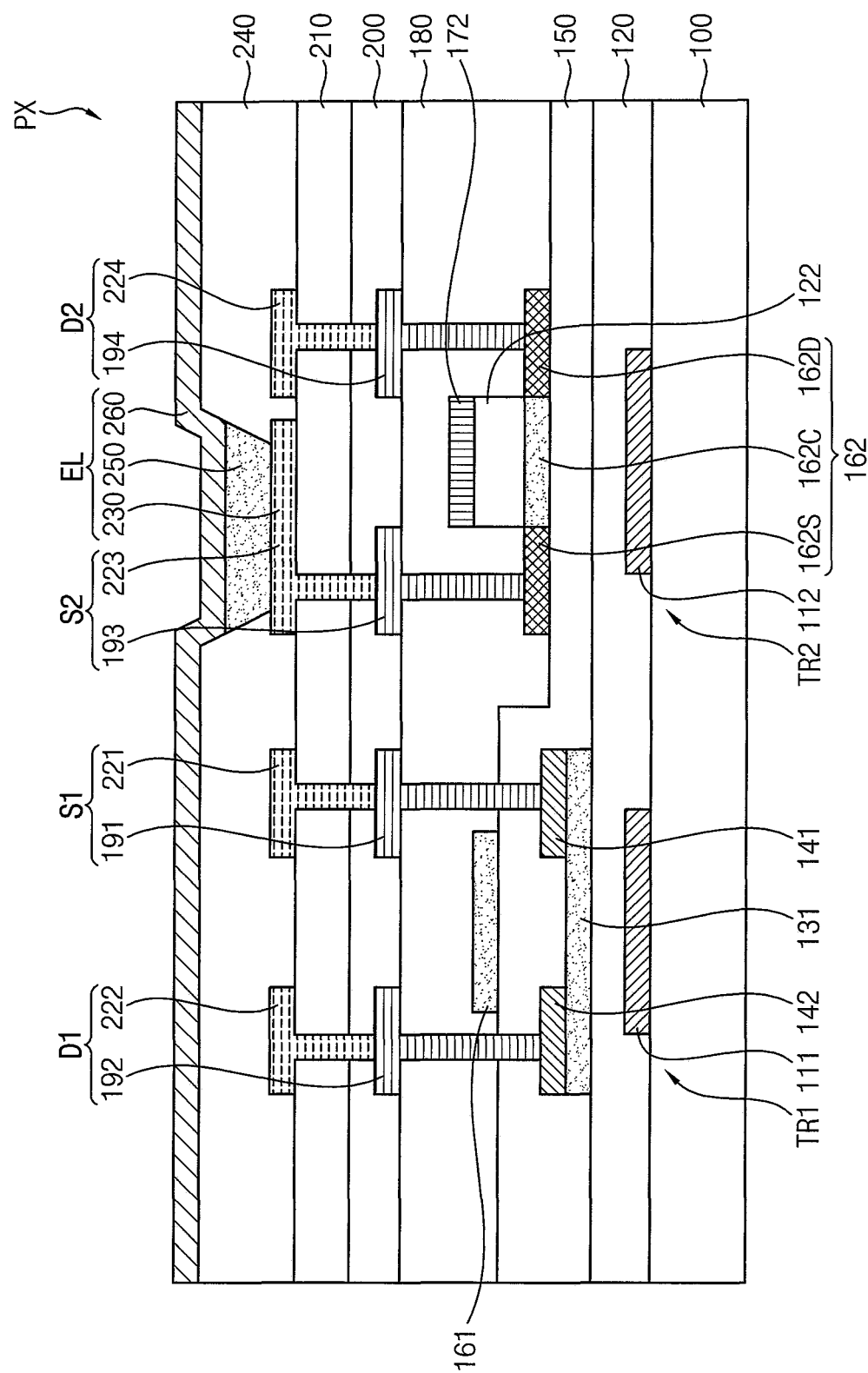
FIG. 6 is a schematic cross-sectional view illustrating a pixel according to an embodiment.

FIG. 6 is a schematic cross-sectional view illustrating a pixel PX according to an embodiment.

The pixel PX described with reference to FIG. 6 may be substantially the same as or similar to the pixel PX described with reference to FIG. 3 except that the pixel PX further includes a protective layer 200. Accordingly, repetitive descriptions will be omitted.

Referring to FIG. 6, in an embodiment, a protective layer 200 may be disposed between the insulation interlayer 180 and the planarization layer 210. The protective layer 200 may overlap the first lower source electrode 191, the first lower drain electrode 192, the second lower source electrode 193, and the second lower drain electrode 194 on the insulation interlayer 180. The protective layer 200 may be formed of an inorganic insulation material such as silicon nitride, silicon oxide, silicon oxynitride, or the like. In case that the planarization layer 210 formed of an organic insulation material is disposed directly on the first lower source electrode 191, the first lower drain electrode 192, the second lower source electrode 193, and the second lower drain electrode 194 (in other words, in case that the planarization layer 210 directly contacts the first lower source electrode 191, the first lower drain electrode 192, the second lower source electrode 193, and the second lower drain electrode 194), the first lower source electrode 191, the first lower drain electrode 192, the second lower source electrode 193, and the second lower drain electrode 194 formed of copper (Cu) or the like may corrode because of chemical reaction with the planarization layer 210. However, in an embodiment, the protective layer 200 overlapping the first lower source electrode 191, the first lower drain electrode 192, the second lower source electrode 193, and the second lower drain electrode 194 may be disposed between the insulation interlayer 180 and the planarization layer 210, so that the first lower source electrode 191, the first lower drain electrode 192, the second lower source electrode 193, and the second lower drain electrode 194 may not corrode.

Figure 7:
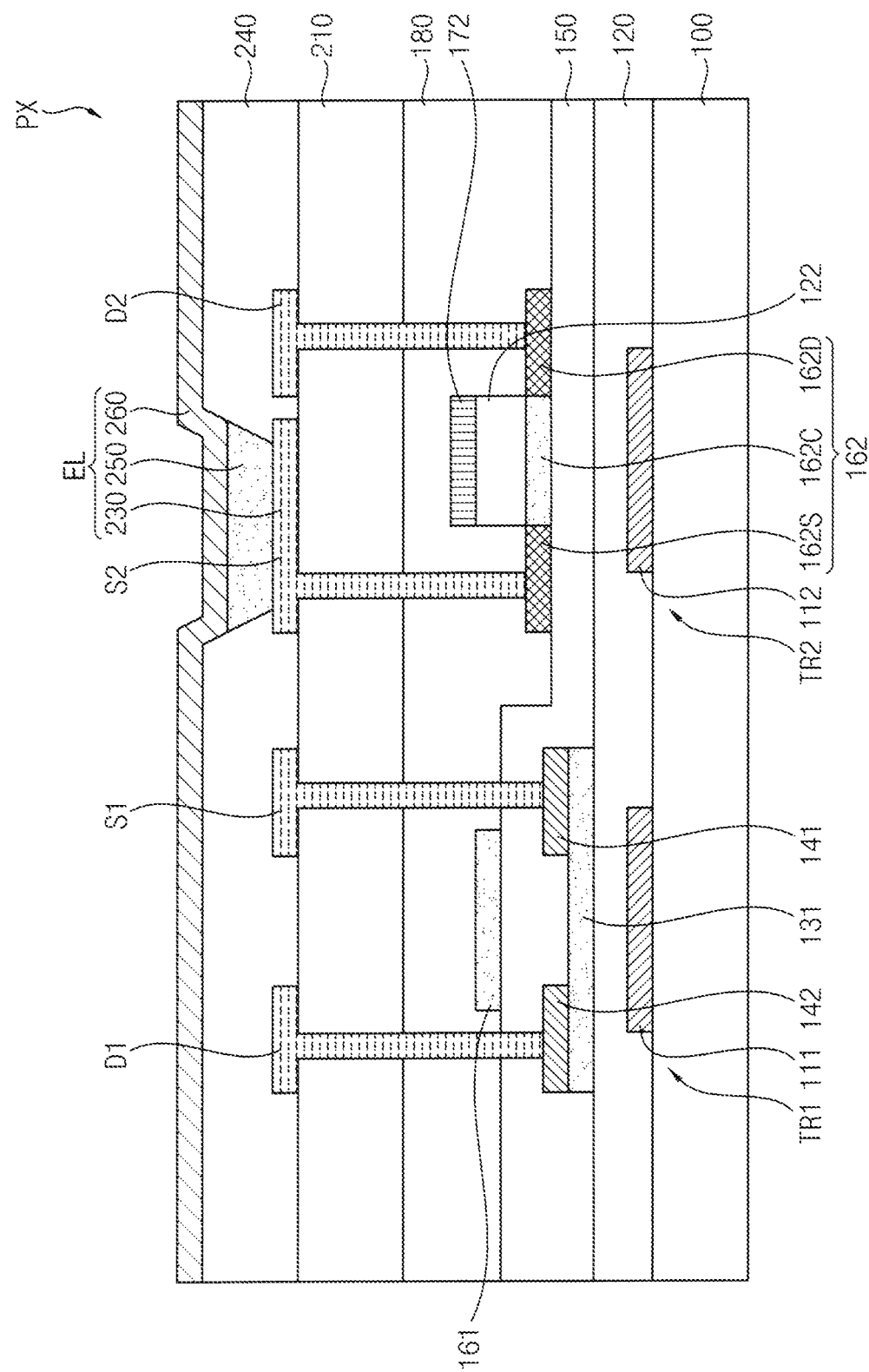
FIG. 7 is a schematic cross-sectional view illustrating a pixel according to an embodiment.

FIG. 7 is a schematic cross-sectional view illustrating a pixel PX according to an embodiment.

The pixel PX described with reference to FIG. 7 may be substantially the same as or similar to the pixel PX described with reference to FIG. 3 except for structures of the first source electrode S1, the first drain electrode D1, the second source electrode S2, and the second drain electrode D2. Accordingly, repetitive descriptions will be omitted.

Referring to FIG. 7, in an embodiment, the first source electrode S1, the first drain electrode D1, the second source electrode S2, and the second drain electrode D2 may be disposed on the planarization layer 210. The first source electrode S1 may be electrically connected to the source pattern 141 through or in a contact hole formed in the insulation layer 150, the insulation interlayer 180 and the planarization layer 210, and the first drain electrode D1 may be electrically connected to the drain pattern 142 through or in a contact hole formed in the insulation layer 150, the insulation interlayer 180 and the planarization layer 210. The second source electrode S2 may be electrically connected to the source region 162S through or in a contact hole formed in the insulation interlayer 180 and the planarization layer 210, and the second drain electrode D2 may be electrically connected to the drain region 162D through or in a contact hole formed in the insulation interlayer 180 and the planarization layer 210. The first source electrode S1, the first drain electrode D1, the second source electrode S2, and the second drain electrode D2 may be formed of (or include) a conductive material such as metal, alloy, transparent conductive oxide, or the like. For example, the conductive material may include silver (Ag), indium tin oxide (ITO), or the like.

The first electrode 230 may be disposed on the planarization layer 210. The second source electrode S2 may extend to form the first electrode 230. In other words, the first electrode 230 and the second source electrode S2 may be integral with each other.

Figure 8:
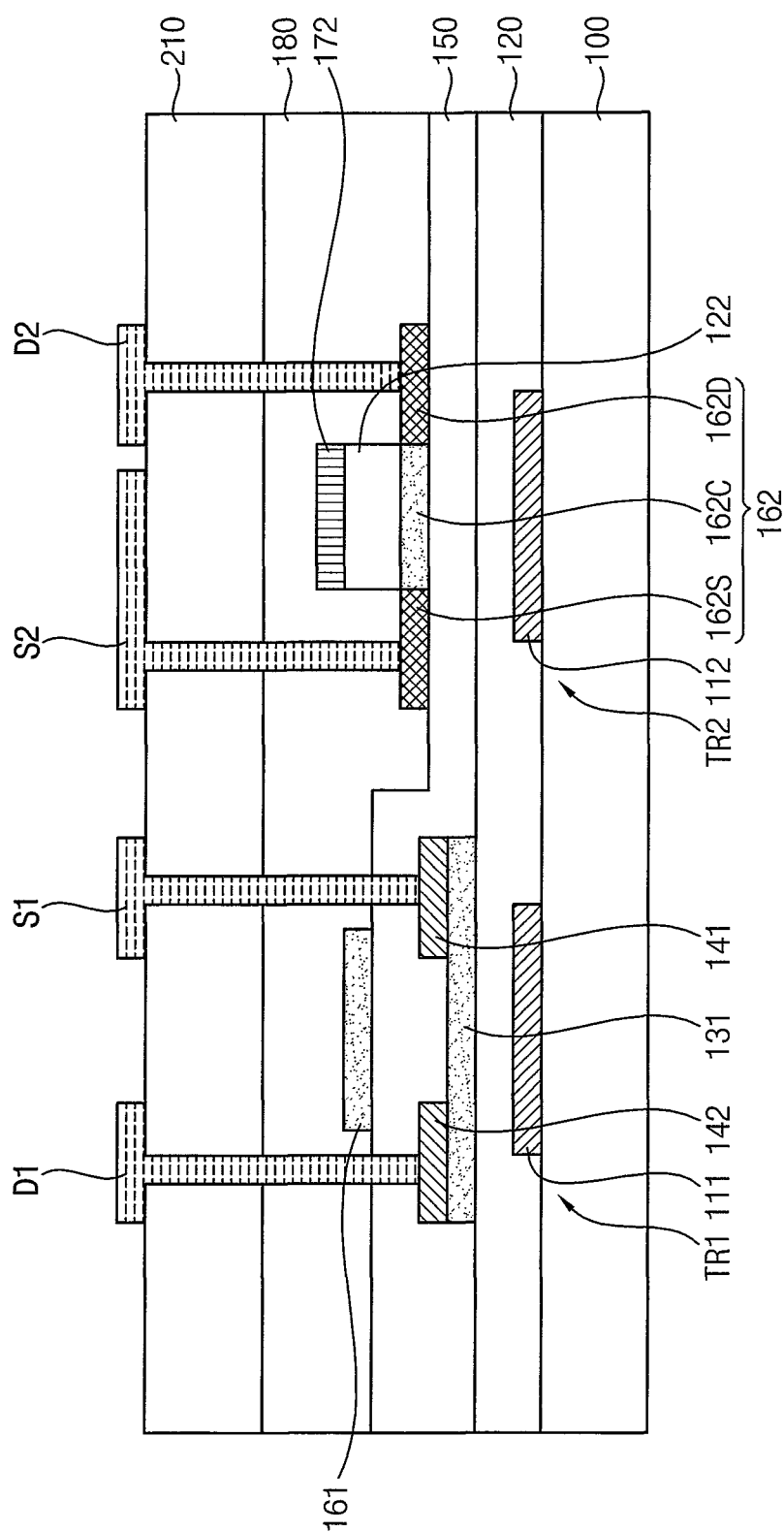
FIG. 8 is a schematic cross-sectional view illustrating a method of manufacturing a display device according to an embodiment.

FIG. 8 is a schematic cross-sectional view illustrating a method of manufacturing a display device according to an embodiment.

The method of manufacturing the display device described with reference to FIGS. 5A to 5H and 8 may be substantially the same as or similar to the method of manufacturing the display device described with reference to FIGS. 5A to 5J except for the formation of the first source electrode S1, the first drain electrode D1, the second source electrode S2, and the second drain electrode D2. Accordingly, repetitive descriptions will be omitted.

Referring to FIG. 8, the insulation interlayer 180 and the planarization layer 210 may be formed on the oxygen supply pattern 161 and the second gate electrode 172, and the first source electrode S1, the first drain electrode D1, the second source electrode S2, and the second drain electrode D2 may be formed on the planarization layer 210.

First, the insulation interlayer 180 overlapping the oxygen supply pattern 161, the second gate electrode 172, and the second active pattern 162 may be formed on the insulation layer 150. Next, the planarization layer 210 may be formed on the insulation interlayer 180.

Then, contact holes respectively exposing the source pattern 141 and the drain pattern 142 may be formed in the insulation layer 150; the insulation interlayer 180 and the planarization layer 210, and contact holes respectively exposing the source region 162S, and the drain region 162D may be formed in the insulation interlayer 180 and the planarization layer 210. Then, a conductive layer filling the contact holes may be formed on the planarization layer 210; and the conductive layer may be etched to form the first source electrode S1, the first drain electrode D1, the second source electrode S2, and the second drain electrode D2.

Figure 9:
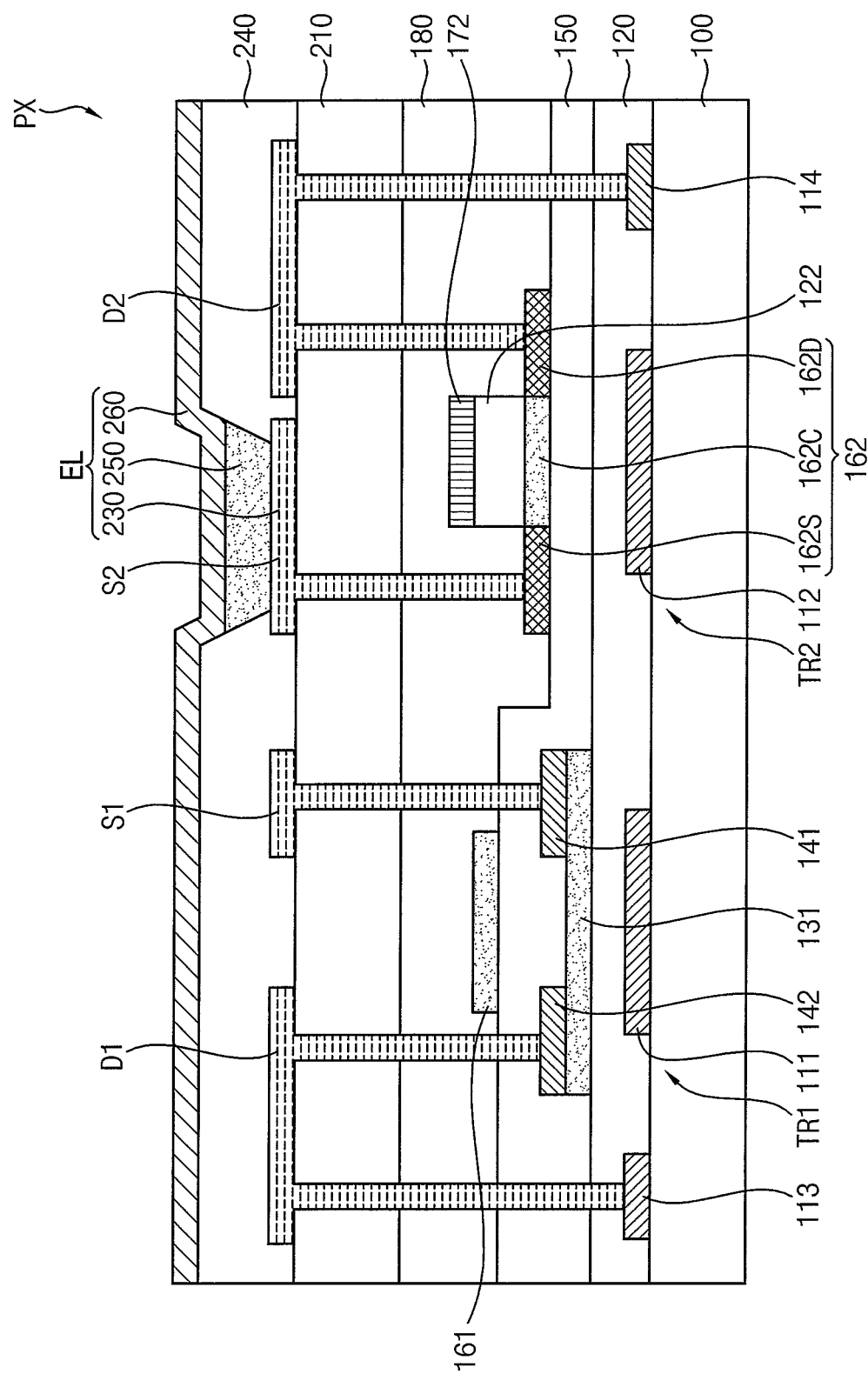
FIG. 9 is a schematic cross-sectional view illustrating a pixel according to an embodiment.

FIG. 9 is a schematic cross-sectional view illustrating a pixel PX according to an embodiment.

The pixel PX described with reference to FIG. 9 may be substantially the same as or similar to the pixel PX described with reference to FIG. 7 except that the pixel PX further includes a data line 113 and a driving voltage line 114. Accordingly, repetitive descriptions will be omitted.

Referring to FIG. 9, in an embodiment, a data line 113 and a driving voltage line 114 may be disposed between the substrate 100 and the buffer layer 120. The data line 113, and the driving voltage line 114, the first gate electrode 111, and the conductive pattern 112 may be formed on substantially the same layer, may be formed of substantially the same material, and may be spaced apart from each other. The data line 113 and the driving voltage line 114 may be spaced apart from the first gate electrode 111 and the conductive pattern 112.

The data line 113 may be electrically connected to the first drain electrode D1. For example, the first drain electrode D1 may electrically contact the data line 113 through or in a contact hole formed in the buffer layer 120, the insulation layer 150, the insulation interlayer 180, and the planarization layer 210. The driving voltage line 114 may be electrically connected to the second drain electrode D2. For example, the second drain electrode D2 may electrically contact the driving voltage line 114 through or in a contact hole formed in the buffer layer 120, the insulation layer 150, the insulation interlayer 180, and the planarization layer 210.

The display device according to the embodiments may be applied to a display device included in a computer, a laptop, a mobile phone, a smartphone, a smart pad, a PMP, a PDA, an MP3 player, or the like.

Although the display devices and the methods of manufacturing the display devices according to the embodiments have been described with reference to the drawings, the illustrated embodiments are examples and may be modified and changed by a person having ordinary skill in the relevant art without departing from the technical spirit described in the following claims.

What is claimed is:

1. A display device, comprising: a first gate electrode disposed on a substrate; a buffer layer disposed on the first gate electrode; a first active pattern disposed on the buffer layer, overlapping the first gate electrode, and including an oxide semiconductor; a source pattern and a drain pattern respectively disposed on ends of the first active pattern; an insulation layer overlapping the source pattern and the drain pattern on the buffer layer; an oxygen supply pattern disposed on the insulation layer, overlapping the first active pattern, and supplying oxygen to the first active pattern; a second active pattern disposed on the insulation layer and completely spaced apart from the oxygen supply pattern in a direction parallel to a main surface of the substrate, the second active pattern including: a channel region; and a source region and a drain region respectively disposed on ends of the channel region; an insulation pattern disposed on the channel region of the second active pattern; and a second gate electrode disposed on the insulation pattern.

2. The display device of claim 1, wherein each of the oxygen supply pattern and the second active pattern includes an oxide semiconductor.

3. The display device of claim 2, wherein the oxygen supply pattern, the second active pattern, and the first active pattern include a same material.

4. The display device of claim 2, wherein each of the oxygen supply pattern and the second active pattern includes a material different from a material of the first active pattern.

5. The display device of claim 1, further comprising:
an insulation interlayer overlapping the oxygen supply pattern and the second gate electrode on the insulation layer;
a first source electrode and a first drain electrode disposed on the insulation interlayer and electrically connected to the source pattern and the drain pattern, respectively; and a second source electrode and a second drain electrode disposed on the insulation interlayer and electrically connected to the source region and the drain region, respectively.

6. The display device of claim 5, further comprising a planarization layer disposed on the insulation interlayer, wherein
the first source electrode includes:
a first lower source electrode disposed on the insulation interlayer; and
a first upper source electrode disposed on the planarization layer and electrically connected to the first lower source electrode,
the first drain electrode includes:
a first lower drain electrode disposed on the insulation interlayer; and
a first upper drain electrode disposed on the planarization layer and electrically connected to the first lower drain electrode,
the second source electrode includes:
a second lower source electrode disposed on the insulation interlayer; and
a second upper source electrode disposed on the planarization layer and electrically connected to the second lower source electrode, and
the second drain electrode includes:
a second lower drain electrode disposed on the insulation interlayer; and
a second upper drain electrode disposed on the planarization layer and electrically connected to the second lower drain electrode.

7. The display device of claim 6, further comprising a protective layer disposed between the insulation interlayer and the planarization layer and overlapping the first lower source electrode, the first lower drain electrode, the second lower source electrode, and the second lower drain electrode.

8. The display device of claim 5, further comprising a planarization layer disposed on the insulation interlayer, wherein the first source electrode, the first drain electrode, the second source electrode, and the second drain electrode are disposed on the planarization layer.

9. The display device of claim 5, further comprising a conductive pattern disposed between the substrate and the buffer layer and overlapping the second active pattern.

10. The display device of claim 9, wherein the conductive pattern is electrically connected to the second source electrode or the second gate electrode.

11. The display device of claim 5, further comprising a data line disposed between the substrate and the buffer layer and electrically connected to the first drain electrode.

12. The display device of claim 5, further comprising a driving voltage line disposed between the substrate and the buffer layer and electrically connected to the second drain electrode.

13. The display device of claim 1, wherein the oxygen supply pattern and the second active pattern are disposed directly on a common layer.

14. A display device, comprising:
a first transistor disposed on a substrate and having a bottom gate structure, the first transistor including a first active pattern including an oxide semiconductor;
an oxygen supply pattern disposed on the first active pattern and supplying oxygen to the first active pattern; and
a second transistor disposed on the substrate and having a top gate structure, the second transistor including a second active pattern, wherein
the oxygen supply pattern and the second active pattern are disposed directly on a same layer, and
the oxygen supply pattern is spaced apart from the first active pattern in a direction perpendicular to a main surface of the substrate.

15. The display device of claim 14, further comprising:
a pixel including a pixel circuit and a light-emitting element electrically connected to the pixel circuit; and
a scan driver that supplies a scan signal to the pixel circuit.

16. The display device of claim 15, wherein the pixel circuit includes the first transistor and the second transistor.

17. The display device of claim 16, wherein the second transistor is electrically connected to the light-emitting element.

18. The display device of claim 15, wherein the scan drive includes the first transistor and the second transistor.

19. The display device of claim 14, wherein the oxygen supply pattern and the second active pattern are completely spaced apart in a direction parallel to a main surface of substrate.

* * * * *